(12) United States Patent
Sato

(10) Patent No.: US 10,048,581 B2
(45) Date of Patent: Aug. 14, 2018

(54) IMPRINTING METHOD, IMPRINTING APPARATUS, AND DEVICE MANUFACTURING METHOD

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 955 days.

(21) Appl. No.: 14/336,953

(22) Filed: Jul. 21, 2014

(65) Prior Publication Data

US 2015/0028506 A1    Jan. 29, 2015

(30) Foreign Application Priority Data

Jul. 23, 2013    (JP) ................................. 2013-152554

(51) Int. Cl.
*G03F 7/00* (2006.01)
*B29L 7/00* (2006.01)

(52) U.S. Cl.
CPC ...... *G03F 7/0002* (2013.01); *B29L 2007/001* (2013.01)

(58) Field of Classification Search
CPC .................................................. G03F 7/0002
See application file for complete search history.

(56) References Cited

U.S. PATENT DOCUMENTS

| 2006/0172553 A1* | 8/2006 | Choi ................... H01L 21/6831 438/780 |
| 2010/0233377 A1* | 9/2010 | Aoki ..................... B29C 59/022 427/355 |
| 2011/0074064 A1* | 3/2011 | Hayashi ................. B82Y 10/00 264/293 |

FOREIGN PATENT DOCUMENTS

| JP | 2010-098310 A | 4/2010 |
| JP | 2012-4463 A | 1/2012 |
| JP | 2012-234913 A | 11/2012 |
| JP | 2013-102137 A | 5/2013 |

\* cited by examiner

*Primary Examiner* — Alison L Hindenland
*Assistant Examiner* — Jamel M Nelson
(74) *Attorney, Agent, or Firm* — Canon U.S.A., Inc. IP Division

(57) ABSTRACT

Arrangement information regarding shot areas is obtained in an imprinting method. When a pattern is sequentially formed in the shot areas, the attraction force of a first attraction area is reduced to less than that of the second attraction area. After the pattern is formed in the shot area corresponding to the first attraction area, the attraction forces of the first and second attraction areas are changed. The position information regarding the shot area corresponding to the second attraction area is obtained, which is compared with the position information regarding the shot area corresponding to the second attraction area based on the arrangement information. If the difference between the compared position information is a threshold value or less, positioning of a substrate and a mold is achieved using the arrangement information. If the difference is greater than the threshold value, the arrangement information regarding the shot areas is obtained again.

10 Claims, 7 Drawing Sheets

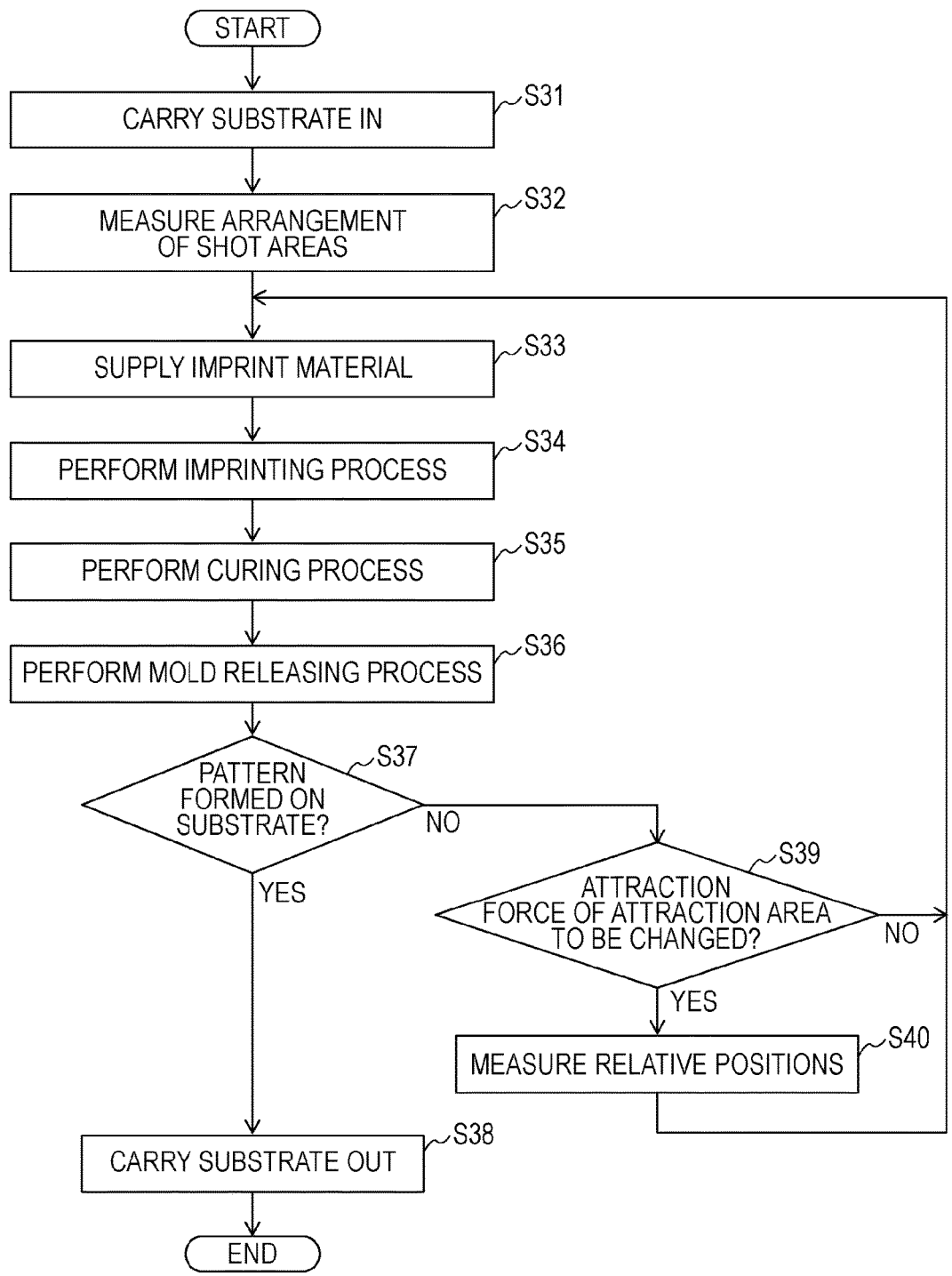

IMPRINTING METHOD, IMPRINTING APPARATUS, AND DEVICE MANUFACTURING METHOD

BACKGROUND

Field

The present invention relates to an imprinting method for forming a pattern in an imprint material deposited on a substrate using a mold having the pattern formed thereon, an imprinting apparatus, and a device manufacturing method.

Description of the Related Art

To manufacture, for example, semiconductor devices, imprinting technology has been developed. Imprinting technology (an imprinting method) is used to form a pattern in an imprint material (a resin material) deposited on a substrate using a mold having the pattern formed thereon. In the imprinting technology, a mold (a mask) having a pattern formed therein using, for example, electron beam lithography equipment is in contact with the imprint material deposited on the substrate (i.e., imprinting). Thereafter, the imprint material is cured with the mold in contact with the imprint material. Subsequently, by increasing the distance between the cured imprint material and the mold (releasing), the pattern can be formed in the imprint material.

In some cases, a plurality of shot areas are formed in the substrate that is carried into an imprinting apparatus. In such cases, the pattern is transferred to each of the shot areas using the above-described imprinting method. After the pattern is transferred to all of the shot areas, the substrate is carried out of the imprinting apparatus.

The substrate that is carried into the imprinting apparatus is held by a substrate holding unit. In general, the substrate holding unit attracts the entire back surface (the entire back area) of the substrate so as to hold the substrate. In contrast, like a substrate holding unit described in Japanese Patent Laid-Open No. 2010-098310, a substrate holding unit has an attraction area partitioned into a plurality of sub-attraction areas.

In addition, as in a substrate holding unit described in Japanese Patent Laid-Open No. 2012-234913, a technology for reducing the occurrence of fall of the pattern in resin when the mold is released has been developed. In this technology, the attraction forces of attraction areas for attracting a portion of the back surface of the substrate corresponding to a shot area to which the pattern is transferred and shot areas in the vicinity are decreased. Thereafter, the mold is released.

Japanese Patent Laid-Open No. 2012-234913 describes a technique for transferring a pattern to the shot areas that are not adjacent to each other so as to avoid the influence of the strain of the substrate. When the pattern is transferred to the shot areas corresponding to different attraction areas, the attraction force of the attraction area used for transferring the pattern is increased (returned) to an original strength. In addition, the attraction forces of the different attraction areas are reduced. Accordingly, when the attraction forces of the attraction areas are changed, strain is induced in the substrate. Thus, the position of the shot area to which the pattern is transferred and which corresponds to the attraction area having a reduced attraction force may be displaced from the original position.

When global alignment that is widely used in lithography apparatuses is performed and if the position of the shot area is displaced relative to the original position due to the above-described strain, the positioning accuracy is reduced.

SUMMARY

Accordingly, the present disclosure provides an imprinting method capable of forming a pattern without decreasing the positioning accuracy even when the position of the shot area to which the pattern is transferred is displaced relative to the substrate holding unit in the case where the substrate holding unit changes the attraction force (holding conditions) for holding the substrate.

According to an aspect disclosed herein, an imprinting method for forming a pattern on a substrate supported by a substrate holding unit having at least a first attraction area and a second attraction area is provided. Attraction forces of the first attraction area and the second attraction area are changeable, and the substrate has a plurality of shot areas, each having an alignment mark formed therein. The pattern is formed in each of the shot areas by curing an imprint material supplied on the substrate with the imprint material in contact with a mold. The method includes, reducing the attraction force of the first attraction area to less than the attraction force of the second attraction area when arrangement information regarding the shot areas are acquired and the pattern is sequentially formed in each of the shot areas using the arrangement information, changing the attraction forces of the first attraction area and the second attraction area after forming the pattern in the shot area corresponding to the first attraction area, detecting the alignment mark in the shot area corresponding to the second attraction area and obtaining position information regarding the shot area corresponding to the second attraction area, comparing the obtained position information with the position information regarding the shot area corresponding to the second attraction area based on the arrangement information, performing positioning of the substrate and the mold using the arrangement information if the difference between the compared position information is less than or equal to a threshold value, and obtaining the arrangement information regarding the shot areas again and performing positioning of the substrate and the mold using the obtained arrangement information if the difference is greater than the threshold value.

Further features of the present invention will become apparent from the following description of exemplary embodiments with reference to the attached drawings.

BRIEF DESCRIPTION OF THE DRAWINGS

FIG. 3 is a flowchart of the flow of the imprinting process.

DESCRIPTION OF THE EMBODIMENTS

Figure 1:
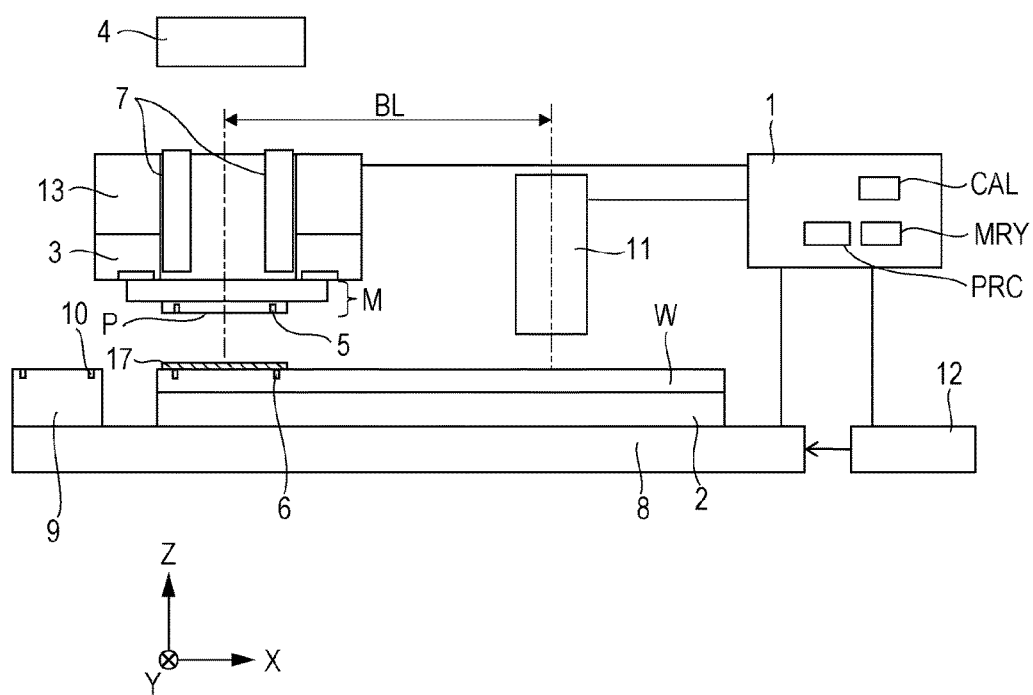
FIG. 1 illustrates an imprinting apparatus.

Exemplary embodiments of the present invention are described in detail below with reference to the accompanying drawings. Note that in the drawings, the same reference numerals are used for the same members and, thus, descriptions of the members are not repeated.

Configuration of Imprinting Apparatus

FIG. 1 illustrates an imprinting apparatus IMP according to an exemplary embodiment. The imprinting apparatus IMP includes a wafer chuck 2 (a substrate holding unit) for holding a substrate W and a mold chuck 3 (a mold holding unit) for holding a mold M. The mold M has a pattern P therein. The pattern P has a concavo-convex shape. In addition, the imprinting apparatus IMP includes a detecting unit 7 for detecting a mark 5 formed on the mold M (a mark on the mold side) and a mark 6 formed on the substrate W (a mark on the substrate side). According to the present exemplary embodiment, a direction in which the mold M is imprinted on the substrate W (a direction in which the mold M is released from the substrate W) is referred to as a Z-axis, and an X-axis and a Y-axis each perpendicular to the Z-axis are determined so as to be parallel to a surface of the substrate W.

The imprinting apparatus IMP may include a plurality of the detecting units 7. In addition, a plurality of the marks 5 and 6 may be detected at the same time. By using the result of detection of the positions of the marks 5 and 6 by the detecting unit 7, the position of the mold M relative to the substrate W can be obtained. By moving a substrate stage 8 (a positioning unit) that holds the wafer chuck 2 on the basis of the obtained relative positions of the mold M and the substrate W, the positioning of the mold M relative to the substrate W can be performed. Alternatively, by moving a mold stage 13 (a positioning unit) that holds the mold chuck 3, the positioning of the mold M relative to the substrate W may be performed. Still alternatively, by simultaneously moving the substrate stage 8 and the mold stage 13 or sequentially moving the substrate stage 8 and the mold stage 13, the positioning may be performed. Accordingly, the positioning unit can be defined as the substrate stage 8 or the mold stage 13. In addition, the detecting unit 7 detects a mark 10 formed on a stage reference member 9 of the substrate stage 8. The mark 10 serves as a reference for positioning the substrate stage 8.

The detecting unit 7 detects the mark 5 and one of the mark 6 and the mark 10. By using the result of detection, the detecting unit 7 obtains the relative positions of the two marks. The detecting unit 7 detects the images of the two marks at the same time. The detecting unit 7 may be formed from a widely used scope including an image forming optical system or a scope that detects a moire fringe signal (an interference signal) based on the two marks. The detecting unit 7 may be a unit for sequentially observing the two marks. For example, by detecting the positions of the mark 5 and one of the mark 6 and the mark 10 relative to an internal reference position (e.g., a mark or a sensor surface), the detecting unit 7 may detect the relative positions of the mark 5 and one of the mark 6 and the mark 10.

The imprinting apparatus IMP further includes an off-axis alignment scope (OAS) 11. The OAS 11 is disposed at a position separated from the center of the pattern P of the mold M by a base line amount BL. After measuring the mark 6 and the mark 10 under the OAS 11, the imprinting apparatus IMP moves the substrate stage 8 to convey the substrate W beneath the mold M on the basis of the base line amount BL. Accordingly, an error caused by driving the stage decreases with decreasing distance between the optical axis of the OAS 11 and the center of the mold M (i.e., the base line amount BL).

To measure the base line amount BL, the mark 10 and the mark 5 are detected by the detecting unit 7 first. Thereafter, the relative positions of the mark 10 and the mark 5 is obtained. Subsequently, the position of the substrate stage 8 is measured using a stage position measurement system 12. At the same time, the substrate stage 8 is moved so that the mark 10 is conveyed to a position beneath the OAS 11. The conveyed mark 10 is detected using the OAS 11 to obtain the position of the mark 10 relative to the OAS 11. By using the result of detection by the detecting unit 7, the result of detection by the OAS 11, and the measurement result of the stage position measurement system 12, the base line amount BL is obtained. Note that to measure the base line amount BL, the mark 6 may be used as the measurement reference instead of the mark 10. Alternatively, a substrate that serves as the measurement reference of the base line amount BL (e.g., a silicon wafer having a desired mark placed thereon) may be used as the measurement reference.

The position of the axis that is perpendicular to the surface of the mold M having the pattern P formed therein and that passes through the center of the pattern P is obtained by using the measurement result of the detecting unit 7. By using a plurality of the detecting units 7, a plurality of the marks 5 formed on the mold M are detected. The positions of the marks 5 relative to the pattern P of the mold M are given from, for example, the design value of the mold M. Accordingly, by detecting the mark 5 using the detecting unit 7, the center of the mold M can be obtained.

The imprinting apparatus IMP further includes a supply unit (a dispenser) (not illustrated) that supplies an imprint material 17 to the substrate W. According to the present exemplary embodiment, the imprint material 17 is a photo-curing resin (an ultraviolet curable resin) that is cured when ultraviolet light is emitted thereto. The ultraviolet light is emitted from a light source 4 provided in the imprinting apparatus IMP.

Figure 2:
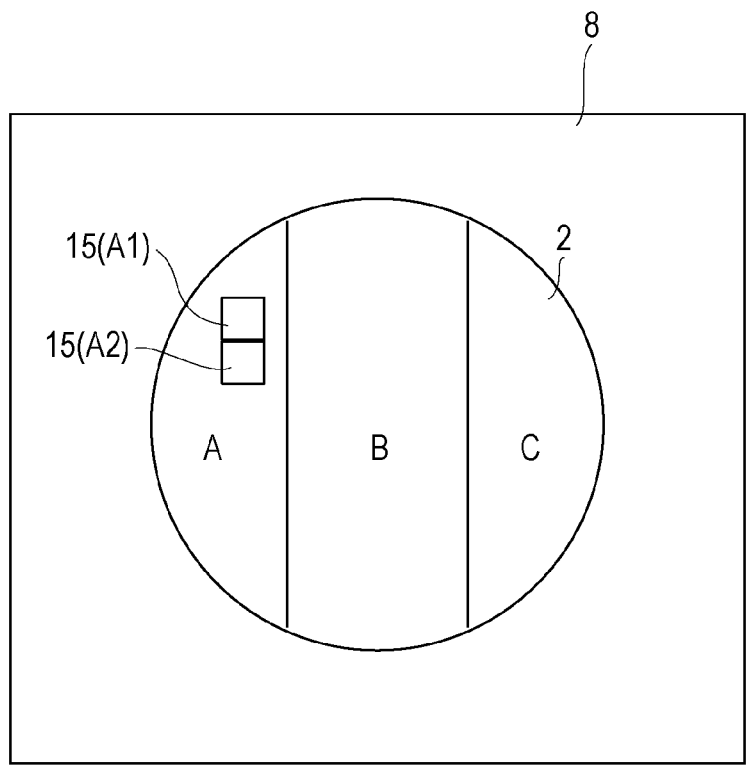
FIG. 2 illustrates a wafer chuck and a substrate stage.

FIG. 2 illustrates the substrate stage 8 and the wafer chuck 2 of the imprinting apparatus IMP viewed in a direction in which the mold M is imprinted onto the substrate W (the Z-axis). According to the present exemplary embodiment, the wafer chuck 2 is a vacuum chuck. The wafer chuck 2 attracts and holds the substrate W. For example, as illustrated in FIG. 2, the wafer chuck 2 is partitioned into three attraction areas, that is, an attraction area A, an attraction area B, and an attraction area C. The holding force for holding the substrate W (e.g., the attraction force) can be independently set (changed) for each of the partitioned attraction area and can be changed. For example, the wafer chuck 2 can change the magnitude of the attraction force for attracting the substrate W to one of "high", "medium", and "low". In this way, the attraction force of one of the three magnitudes can be set without dividing the wafer chuck 2.

Imprinting Process

FIG. 3 is a flowchart of the flow of the imprinting process according to the present exemplary embodiment. Hereinafter, the imprinting process is performed by the imprinting apparatus IMP. The imprinting process illustrated in FIG. 3 is performed by executing a program stored in a memory MRY of a control unit 1 illustrated in FIG. 1. The program stored in the memory MRY is executed by a processor PRC of the control unit 1. In this manner, the above-described imprint operation according to the present exemplary embodiment is performed on the basis of the program stored in the memory MRY of the control unit.

When the imprinting process starts, a substrate conveyance unit (not illustrated) carries the substrate W into the imprinting apparatus IMP (step S31). Thus, the substrate W is placed on the wafer chuck 2.

After the substrate W is carried in, the OAS 11 detects the mark 6 formed on the substrate W and measures the arrangement information regarding a plurality of shot areas formed on the substrate W (the position information regarding the shot areas) using the result of detection (step S32). According to the present exemplary embodiment, the mark 6 formed in each of the shot areas (some of the plurality of shots, that is, a sample shot group) of the substrate is detected, and the arrangement of the shot areas (all the shots) is obtained from the result of detection. Thereafter, positioning of the mold and the substrate is performed on the basis of the obtained arrangement. That is, the following description is made when positioning is performed using the global alignment. To measure the arrangement of a plurality of the shot areas of the substrate, the marks may be detected using the detecting unit 7 instead of the OAS 11.

After the arrangement of the shot areas is obtained, the substrate stage 8 moves so that the imprint material 17 is supplied to the shot area to which the pattern is to be transferred. By moving the substrate stage 8, the shot area to which the imprint material 17 is to be supplied is located beneath the supply unit. The imprint material 17 is supplied onto the substrate W through an ejection port of the supply unit (step S33). According to the present exemplary embodiment, the imprint material is supplied onto each of the shot areas, and the pattern is sequentially transferred. However, in the process to supply an imprint material performed in step S33, the imprint material may be supplied onto a plurality of the shot areas, or the imprint material is supplied to the entire surface of the substrate in one go.

The shot area having the imprint material 17 supplied thereon moves to a position beneath the mold M having the pattern P formed thereon on the basis of the arrangement of the shot areas obtained in step S32. After the shot area moves, the substrate W is brought closer to the mold M (the distance is reduced) until the imprint material 17 on the substrate W is brought into contact with the pattern P of the mold M. The imprint material 17 and the pattern P are pressed against each other, and a concave portion of the pattern P is filled with the imprint material 17 (step S34, a mold pressing step).

After the concave portion of the pattern P is filled with the imprint material 17, ultraviolet light is emitted onto the mold M (the pattern P) and the imprint material 17 with the mold M in contact with the imprint material 17. In this way, the imprint material 17 is cured (step S35, a curing process). The mold M is made of a material that allows ultraviolet light to pass therethrough (e.g., quartz). The ultraviolet light emitted from the light source 4 passes through the mold M and is emitted onto the imprint material 17.

After the ultraviolet light is emitted and the imprint material 17 is cured, the distance between the substrate W and the mold M is increased so that the mold M is separated from the imprint material 17 (step S36, a mold releasing process). By separating the mold M from the cured imprint material 17, the pattern is formed in (transferred to) the imprint material 17 on the substrate. In this mold releasing process, the mold M may be separated from the imprint material 17 by driving the mold stage 13 or by driving the substrate stage 8. Alternatively, the mold M may be separated from the imprint material 17 by driving the mold stage 13 and the substrate stage 8 simultaneously or sequentially.

After the pattern is formed in the imprint material in the mold releasing process (i.e., in step S36), it is determined whether the pattern is formed in all of the shot areas of the substrate W (step S37). After pattern formation is completed, the substrate W is carried out of the imprinting apparatus IMP (step S38). A substrate conveyance unit (not illustrated) carries the substrate W out of the wafer chuck 2 to the outside of the imprinting apparatus IMP. Thus, the imprinting process is completed.

However, if the pattern has not been formed in all of the shot areas of the substrate W, it is determined whether the attraction force of each of the partitioned attraction areas is to be changed (step S39). If it is determined that the attraction force of at least one of the attraction areas is changed, relative position measurement described below is performed (step S40). However, if the attraction force of the attraction area is not changed, the processing returns to step S33, where the imprint material 17 is supplied to the shot area in which the pattern is to be formed next. If the attraction force of the attraction area is not changed, the position of the shot area in which the pattern is to be formed next is not displaced relative to the wafer chuck 2. Accordingly, the substrate stage 8 can be moved on the basis of the arrangement of the shot areas measured in step S32. After the imprint material is supplied to the shot area, the mold pressing step is performed in step S34. In addition, the curing process is performed in step S35, and the mold releasing process is performed in step S36. In this manner, the pattern is formed on the substrate.

Positioning and pattern formation are sequentially performed for each of the shot areas of the substrate. By repeating the series of the imprinting processes, the pattern P that is formed in the mold M can be formed on the substrate W at each of the shot positions.

Pattern Fall Reduction Control in Mold Releasing Process

Pattern fall (collapse of the pattern) that possibly occurs when the mold M is separated from the cured imprint material 17 (in the mold releasing process) and an imprinting method for reducing the occurrence of the pattern fall are described below with reference to FIGS. 4A and 4B. By controlling the amount of deformation of the substrate W by changing the attraction force of the wafer chuck 2 in accordance with a position during the mold releasing process in step S36, the occurrence of pattern fall can be reduced. The amount of deformation of the substrate W in the mold releasing process is controlled by the magnitude of the attraction force of the wafer chuck 2 for holding the substrate W.

Figure 4A:
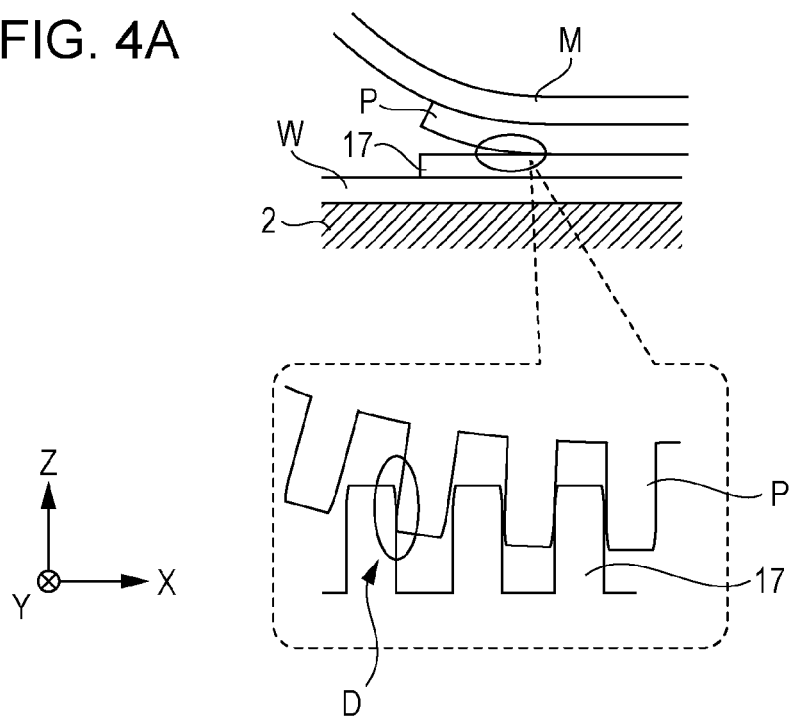
FIGS. 4A and 4B illustrate a mold releasing process performed in accordance with a magnitude of the attraction force of an attraction area.
Figure 4B:
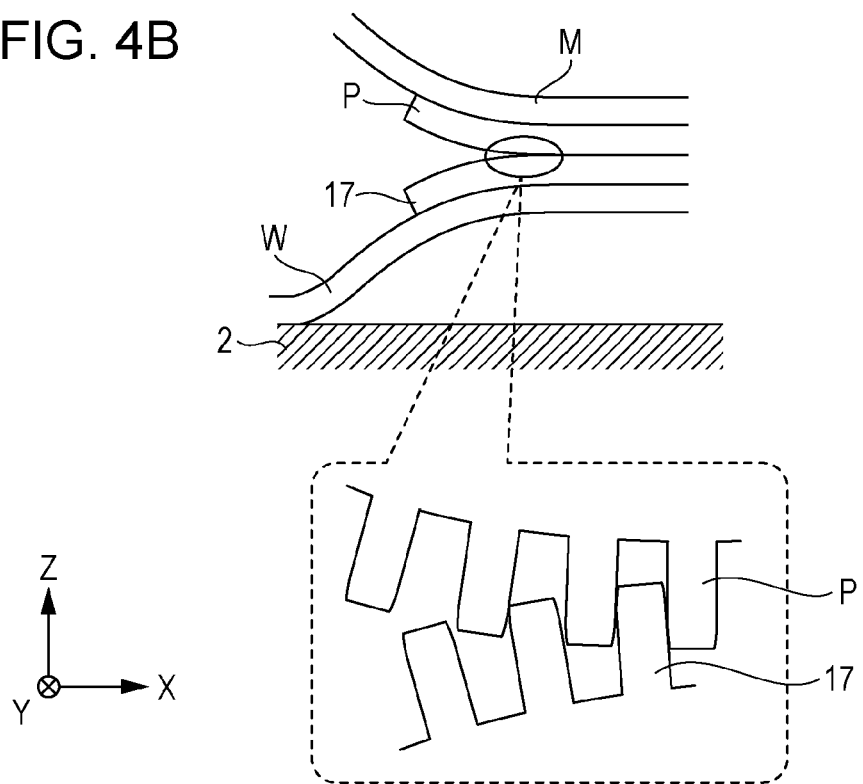

FIGS. 4A and 4B are cross-sectional views of the mold M and the substrate W during the mold releasing process. The attraction area of the wafer chuck 2 is partitioned into a plurality of sub-attraction areas. The attraction force of each of the sub-attraction areas can be independently set and changed. The following description is made on the basis of the magnitude of the attraction force that can be set to, for example, one of "high", "medium", and "low". Herein, the magnitude of the attraction force is determined as follows. That is, when the magnitude of the attraction force is set to "high", the substrate W is strongly attracted to the wafer chuck 2 during the mold releasing process so that the substrate W is not displaced relative to the wafer chuck 2. When the magnitude of the attraction force is set to "medium", the substrate W is weakly attracted to the wafer chuck 2 during the mold releasing process. Thus, as described below, the substrate W can be deflected while following the mold M. When magnitude of the attraction force is set to "low", the substrate W is attracted to the wafer chuck 2 by such a force that the surface of the substrate subjected to the strain caused by deflection of the substrate W can return to its original shape of the surface of the substrate.

FIG. 4A is a cross-sectional view of the substrate W and the mold M when the magnitude of the attraction force of the attraction area for holding the substrate W by the wafer chuck 2 is set to "high" during the mold releasing process. Since the attraction force of the wafer chuck 2 is high when the distance between the cured imprint material 17 and the mold M is increased, the substrate W is fixed to the wafer chuck 2. Accordingly, as illustrated by "D" in FIG. 4A, a force is exerted on the pattern formed in the substrate W by the pattern P of the mold M during the mold releasing process in the lateral direction. Thus, the pattern formed in the imprint material 17 may fall in the lateral direction.

FIG. 4B is a cross-sectional view of the substrate W and the mold M when the magnitude of the attraction force of the attraction area for holding the substrate W by the wafer chuck 2 is set to "medium" during the mold releasing process. Since the attraction force of the wafer chuck 2 is lower than in FIG. 4A when the distance between the cured imprint material 17 and the mold M is increased, the pattern is influenced by a force in the mold releasing direction (the Z direction). Accordingly, part of the substrate W is separated from the wafer chuck 2. Thus, the mold M and the substrate W are deflected during the mold releasing process and, therefore, the distance between the imprint material 17 cured into a toothed gear shape and the mold M increases, as illustrated in FIG. 4B. Since the mold M is released from the imprint material 17 in this manner, the pattern transferred to the imprint material 17 on the substrate negligibly receives a force in the lateral direction. Thus, the occurrence of pattern fall illustrated in FIG. 4A can be reduced.

The attraction force of each of the partitioned attraction areas in the case in which a pattern is transferred to the shot area of the substrate W corresponding to the attraction area A of the wafer chuck 2 illustrated in FIG. 2 is discussed below. As described above, by performing the imprinting process after the magnitude of the attraction force of the attraction area A is set to "medium", the occurrence of pattern fall during the mold releasing process can be reduced. It takes time to change the magnitude of the attraction force of the attraction area. Accordingly, when the pattern is transferred to the shot area corresponding to the attraction area A, the imprinting process is performed without changing the magnitude of the attraction force from "medium". During the mold pressing step, the mold M and the imprint material 17 are in light contact with each other. Accordingly, the mold M is negligibly displaced relative to the wafer chuck 2. In contrast, to avoid the influence on the vicinity of the shot area to which the pattern is transferred during the mold releasing process, the pattern is sequentially transferred by excluding an adjacent shot area, in general, as described in Japanese Patent Laid-Open No. 2012-234913. If the magnitudes of the attraction forces for all of the attraction areas are set to "medium", the whole substrate W may be displaced relative to the wafer chuck 2 due to a force exerted on the substrate W during the mold releasing process. Therefore, to prevent the substrate W from being displaced relative to the wafer chuck 2, the attraction force of at least one of the attraction area B and the attraction area C is set to "high". By controlling the magnitude of the attraction force of the wafer chuck 2 for each of the partitioned areas in this manner, displacement of the substrate W can be prevented and, at the same time, the occurrence of pattern fall during the mold releasing process can be reduced.

Problem of Attraction Force Change Control

After the pattern is transferred to the shot area of the substrate W corresponding to the attraction area A, the magnitude of the attraction force of the other areas is changed (set) to "medium". The pattern need not be transferred to all the shot areas corresponding to the attraction area A. For example, after the pattern is transferred to the shot areas that are not adjacent to each other, the attraction force of the attraction area may be changed. Thereafter, the pattern is transferred to the shot area of the substrate W corresponding to the attraction area for which the magnitude of the attraction force is set to "medium". For example, transfer of the pattern to the shot area of the substrate W corresponding to the attraction area B after transfer of the pattern to the shot area corresponding to the attraction area A is discussed. In such a case, the magnitude of the attraction force of the attraction area A is changed from "medium" to "high", and the magnitude of the attraction force of the attraction area B is changed from "high" to "medium".

In a currently used semiconductor device manufacturing process, a relative positional displacement (the overlay accuracy) between a pattern previously formed on a substrate before an imprinting process is performed and a transferred pattern formed on the substrate through the imprinting process needs to be within several nm. However, when the magnitude of the attraction force of the attraction area is changed, positional displacement between the substrate W and the wafer chuck 2 (the substrate stage 8) that does not meet the required overlay accuracy may occur.

For example, the strain may be accumulated in the substrate W due to the mold releasing process performed on the shot area of the substrate W corresponding to the attraction area A. Accordingly, when the magnitude of the attraction force of the attraction area is changed, the substrate W (the shot area) may be displaced relative to the substrate stage 8. In addition, when the magnitude of the attraction force of the attraction area A is changed from "medium" to "high" and if the magnitude of the attraction force of the attraction area B is changed from "high" to "medium", the strain in the attraction area A may be transferred to the attraction area B. In such a case, the substrate W (the shot area of the attraction area B) may be displaced relative to the substrate stage 8.

In particular, positioning based on the global alignment is performed on the assumption that the relative positions between the substrate stage 8 and the substrate W (each of the shot areas) remain unchanged. If positioning based on the global alignment is performed with the substrate stage 8 displaced relative to the substrate W and, thereafter, the pattern is formed, a positioning error occurs due to the positional displacement. That is, as described above, part of the substrate W locally deforms during the imprinting process, and the positional displacement relative to the wafer chuck 2 occurs. As a result, the overlay accuracy decreases.

Therefore, according to the present exemplary embodiment, when the magnitude of the attraction force of each of the partitioned attraction areas is changed, relative position measurement is performed in step S40 of FIG. 3 in order to determine whether the positional displacement of the shot area of the substrate W relative to the substrate stage 8 occurs. In addition, if the relative positional displacement occurs, the influence of the positional displacement is reduced, and the imprinting process is performed. At that time, the positioning technique for the other shot areas is changed in accordance with the amount of relative positional displacement. A method for changing the positioning technique is descried below.

First Exemplary Embodiment

An imprinting method for reducing the influence caused by positional displacement even when the substrate W (the shot area) is displaced relative to the wafer chuck 2 is described below.

Figure 5A:
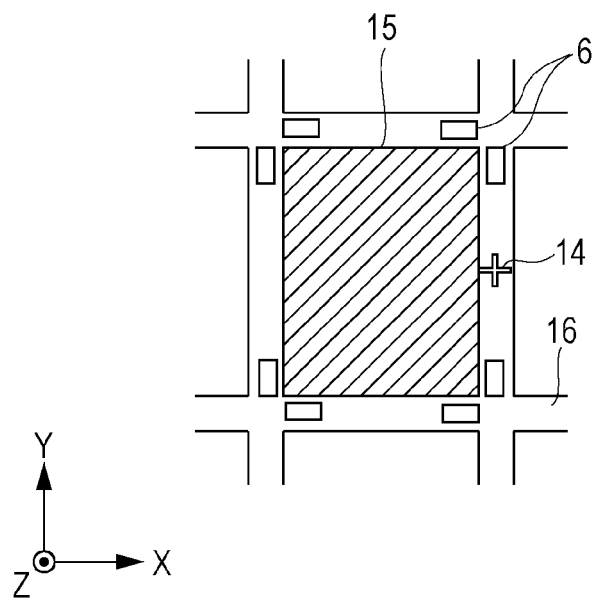
FIGS. 5A and 5B illustrate a shot area defined in a substrate and a mark formed on the substrate.
Figure 5B:
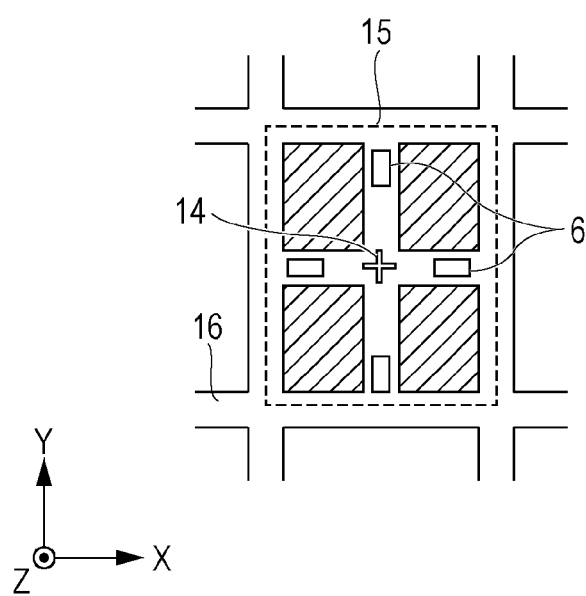

In the imprinting method according to the present exemplary embodiment, the imprinting process is performed in accordance with the flowchart illustrated in FIG. 3. To perform positioning based on the global alignment, the arrangement of the shot areas is measured, as described in step S32. According to the present exemplary embodiment, in addition to the mark 6, an alignment mark 14 formed for each of a plurality of shot areas 15 of the substrate W is detected by using the OAS 11. FIGS. 5A and 5B illustrate the shot area 15 formed on the substrate W and the marks corresponding to the shot area 15. As illustrated in FIG. 5A, the marks 6 and the alignment mark 14 formed on the substrate W are disposed on a scribe line 16, which is used when a plurality of chips formed in the substrate is separated. Although the marks 6 and the alignment mark 14 are illustrated so as to be separated from the shot area 15, the marks 6 and the alignment mark 14 may be included in the shot area 15. Alternatively, as illustrated in FIG. 5B, the shot area 15 (an area surrounded by a dotted line) may include the scribe line 16. Still alternatively, as illustrated in FIG. 5B, if a plurality of chips are formed inside of the shot area 15, the marks 6 and the alignment mark 14 may be formed inside of the shot area 15.

The control unit 1 (refer to FIG. 1) performs statistical processing on the result of detection performed by the OAS 11 and obtains the arrangement (the position information) of a plurality of the shot areas 15 formed on the substrate. The alignment mark 14 need not be detected by the OAS 11 for all of the shot areas 15 of the substrate W. It is sufficient to detect the alignment marks 14 formed in desired shot areas (sample shots). According to the present exemplary embodiment, the alignment mark 14 is a mark other than the mark 6. However, a mark 6 can be used as an alignment mark 14.

Figure 6:
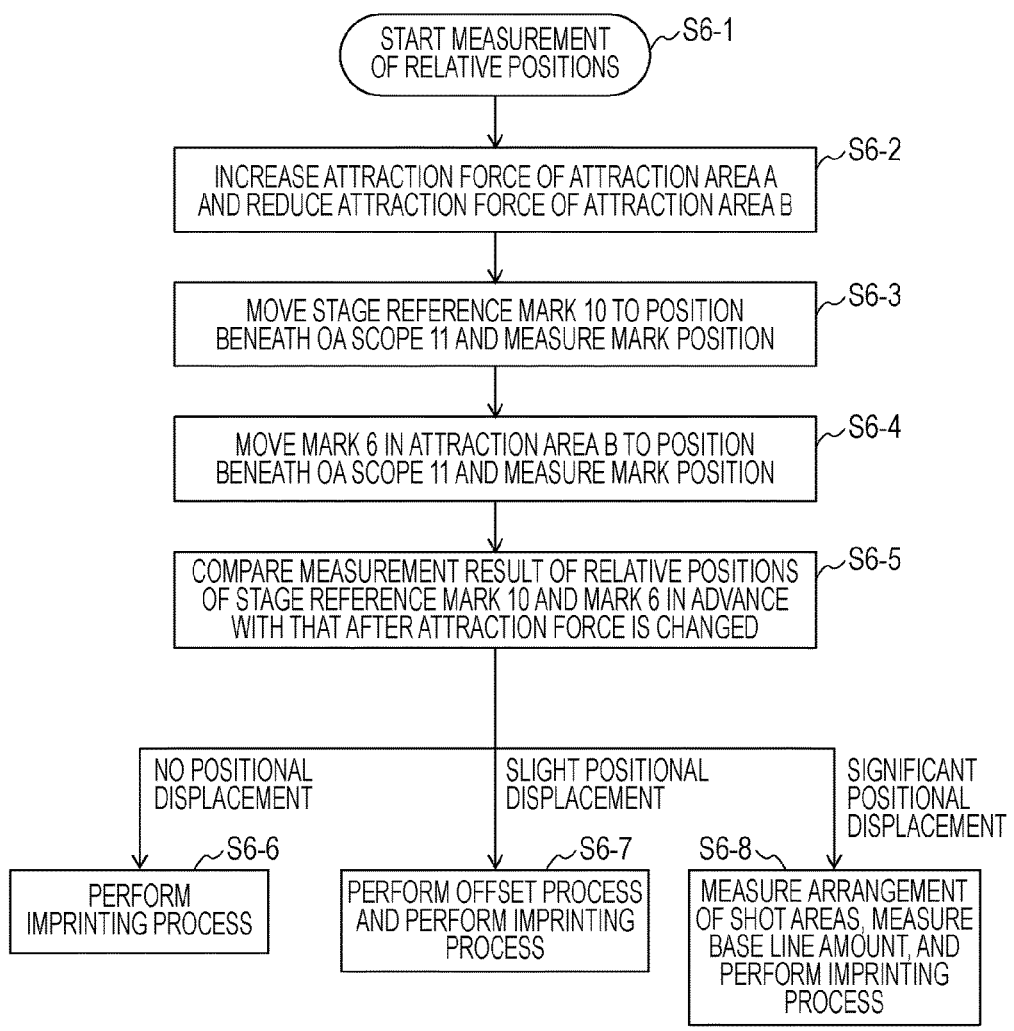
FIG. 6 illustrates the processing flow of measurement of a relative position according to a first exemplary embodiment.

The relative position measurement (step S40 illustrated in FIG. 3) according to the present exemplary embodiment is described below with reference to FIG. 6. FIG. 6 illustrates the processing flow of the relative position measurement used in the imprinting method according to the present exemplary embodiment. The following description is made with reference to the case in which after a pattern is formed in the shot areas 15 of the substrate W (e.g., the shot areas 15 (A1) and 15 (A2) illustrated in FIG. 2) corresponding to the attraction area A, the pattern is formed in the shot area of the substrate W corresponding to the attraction area B. When the pattern is formed in the shot areas 15 of the substrate W corresponding to the attraction area A (a first attraction area), the magnitude of the attraction force of the attraction area A is set to "medium", and the magnitudes of the attraction forces for the attraction areas B and C are set to "high".

If, after the pattern is formed in the shot areas of the substrate W corresponding to the attraction area A, the magnitude of the attraction force of the attraction area A is changed (YES in step S39 of FIG. 3), the relative position measurement (step S40 of FIG. 3) is started (step S6-1).

To form the pattern in the shot area 15 of the substrate W corresponding to the attraction area B (the second attraction area), the magnitude of the attraction force of the attraction area B is set to "medium". In this case, the attraction force of the attraction area A is increased, and the attraction force of the attraction area B is decreased (step S6-2). For example, the magnitude of the attraction force of the attraction area A is changed from "medium" to "high", and the magnitude of the attraction force of the attraction area B is changed from "high" to "medium". As illustrated in FIG. 4B, the attraction force of the attraction area B is set to such a magnitude that part of the substrate W around the shot area 15 deforms (deflects) during the mold releasing process. Since the magnitude of the attraction force of the attraction area B is changed, relative positional displacement between the substrate W (the shot area corresponding to the attraction area B) is measured in order to determine whether relative positional displacement occurs.

Subsequently, the substrate stage 8 moves so that the mark 10 formed on the stage reference member 9 is located beneath the OAS 11 on the basis of the measurement value output from the stage position measurement system 12. The OAS 11 detects the mark 10, and the position of the mark 10 is measured (step S6-3).

Subsequently, the substrate stage 8 moves on the basis of the measurement value output from the stage position measurement system 12 so that the mark 6 formed in the area of the substrate W corresponding to the attraction area B is located beneath the OAS 11. The OAS 11 detects the mark 6, and the position of the mark 6 is measured (step S6-4). Note that the OAS 11 may detect the alignment mark 14 instead of the mark 6.

At that time, the position of the stage reference member 9 (the mark 10) disposed on the substrate stage 8 and the position of the mark 6 formed on the substrate W are given from the pre-measured base line amount and the information regarding the arrangement of the shot areas (the position information). Accordingly, the pre-measured relative position between the mark 10 and the mark 6 is compared with the relative position between the mark 10 and the mark 6 obtained from the measurement results in steps S6-3 and S6-4 (step S6-5). When the magnitude of the attraction force of the attraction area is changed and if the positional displacement of the substrate W does not occur, it is determined that the mark 6 is located at the given position that is pre-measured.

The case in which the result of comparison of the relative positions in step S6-5 indicates no difference (no positional displacement), the case in which a result of comparison of the result of comparison and a threshold value indicates slight difference, and the case in which a result of comparison of the result of comparison and the threshold value indicates significant difference are described below.

If, as the result of comparison of the relative positions in step S6-5, if the positional displacement is sufficiently smaller than a threshold value of a difference between relative positions, which is used to determine whether offset of the amount of positional displacement (described in more detail below) or re-measurement is required, it can be determined that the positional displacement of the substrate W does not occur since the attraction force of the attraction area is changed. If the comparison of the measurement results of relative position indicates a difference that has no impact on positioning based on the global alignment, it can be determined that the difference is negligible. In such a case, positioning based on the global alignment is performed on the basis of the arrangement of the shot areas obtained in advance. More specifically, after the relative position measurement (step S40 in FIG. 3) is performed, positioning based on the global alignment is performed on the shot area of the substrate W corresponding to the attraction area B. Thereafter, the imprinting process is repeated (step S6-6).

If, as a result of comparison of the measurement results of relative positions in step S6-5, the difference is slight (if the difference is less than or equal to a predetermined threshold value), the substrate W may be slightly displaced relative to the substrate stage 8. However, since the amount of positional displacement is small, positioning of the next shot area of the substrate W is performed by using the obtained amount of positional displacement as an offset. In this manner, even when the positional displacement of the shot area occurs due to a change in the magnitude of the attraction force of the attraction area, the amount of positional displacement can be corrected. The positioning of the shot area of the substrate W corresponding to the attraction area B is performed on the basis of the sum of the result of measurement of the arrangement of the shot areas in step S32 and the amount of positional displacement serving as an offset. As described above, the processing returns to step S33 of FIG. 3, where the imprinting process is performed on the basis of the positioning using an offset process (step S6-7).

However, if, as a result of comparison of the measurement results of relative positions in step S6-5, the difference is significant (if the difference is greater than the predetermined threshold value), the substrate W may be significantly displaced relative to the substrate stage 8. If the position of the substrate W is significantly displaced, components related to a variety of errors, such as strain or magnification, may be changed in addition to a shift component. Accordingly, in such a case, measurement of the positions of a plurality of sample shots of the wafer and measurement of the base line amount BL are performed again. Thus, the processing returns to step S33 in FIG. 3, where the imprinting process is performed on the basis of the arrangement of newly obtained shot areas and the newly obtained base line amount BL (step S6-8).

The criterion (the threshold value) for determining the level of the difference (the amount of positional displacement) obtained as a result of comparison of the measurement results of relative positions in step S6-5 may be appropriately determined in accordance with the overlay accuracy required at that time.

According to the first exemplary embodiment, the processing flow of the measurement of relative positions between the stage reference member 9 and the substrate W performed after the attraction force of the attraction area is changed has been described. If the accuracy of the base line amount BL and the accuracy of the stage position measurement system 12 are sufficiently stable and, thus, the positioning accuracy of the substrate stage 8 is sufficiently ensured, the step of measurement of the mark 10 (step S6-3) may be removed. In such a case, the amount of positional displacement from the substrate stage 8 may be obtained by comparing the arrangement of the shots on the substrate W pre-measured in step S32 of FIG. 3 with the measurement result of the position of the mark 6 measured in step S6-4.

As described above, even when the substrate W is displaced relative to the substrate stage 8 due to a change in the magnitude of the attraction force of the attraction area, the flow that is suitable for the amount of positional displacement can be selected and, thus, the imprinting process that reduces a decrease in the positioning accuracy can be performed.

Die-by-Die Alignment Technique

According to the first exemplary embodiment, by detecting a mark on the substrate before the pattern is formed, the arrangement of a plurality of shot areas is measured. Thereafter, the positioning of the substrate is performed on the basis of the result of measurement, and the imprinting process is performed. However, the method for positioning is not limited to the global alignment.

For example, when the pattern is formed in the shot areas of the substrate, the detecting unit 7 may detect the mark on the mold and the mark in the shot area for each of the shot areas and correct the positions of the mold and each of the shot areas of the substrate. Such a technique is referred to as a "die-by-die alignment technique". Even in the die-by-die alignment technique, to detect the mark 5 on the mold and the mark 6 on the substrate using the detecting unit 7, the shot area of the substrate needs to be positioned beneath the mold (at an imprint position) within a predetermined range. If the shot area cannot be positioned within the predetermined range, it takes much time to detect the mark 6 on the substrate. Accordingly, the productivity of the imprinting apparatus may decrease.

Therefore, in general, before the pattern is formed on the substrate, the mark formed on the substrate is detected in step S32 of FIG. 3, and the arrangement of the shot areas is roughly measured. The substrate stage 8 is moved on the basis of the result of measurement, the imprint material is supplied onto the substrate, and the shot area in which the pattern is to be formed is moved to a position beneath the mold. Since the arrangement of the shot areas is obtained, the detecting unit 7 can detect the mark 5 and the mark 6 in a short time to align the mold with the substrate.

Even in the die-by-die alignment, when the magnitude of the attraction force of the attraction area is changed, the substrate W may be displaced relative to the substrate stage 8. If such positional displacement occurs, the detecting unit 7 may not detect the mark 6 on the substrate even when the substrate W is moved to the position beneath the mold (the imprint position) in accordance with the arrangement of the shot areas obtained in advance. Accordingly, even in the die-by-die alignment, when the attraction force of the attraction area is changed, the relative position measurement using the OAS 11 as the detecting unit can be applied in step S40 of FIG. 3.

Second Exemplary Embodiment

Figure 7:
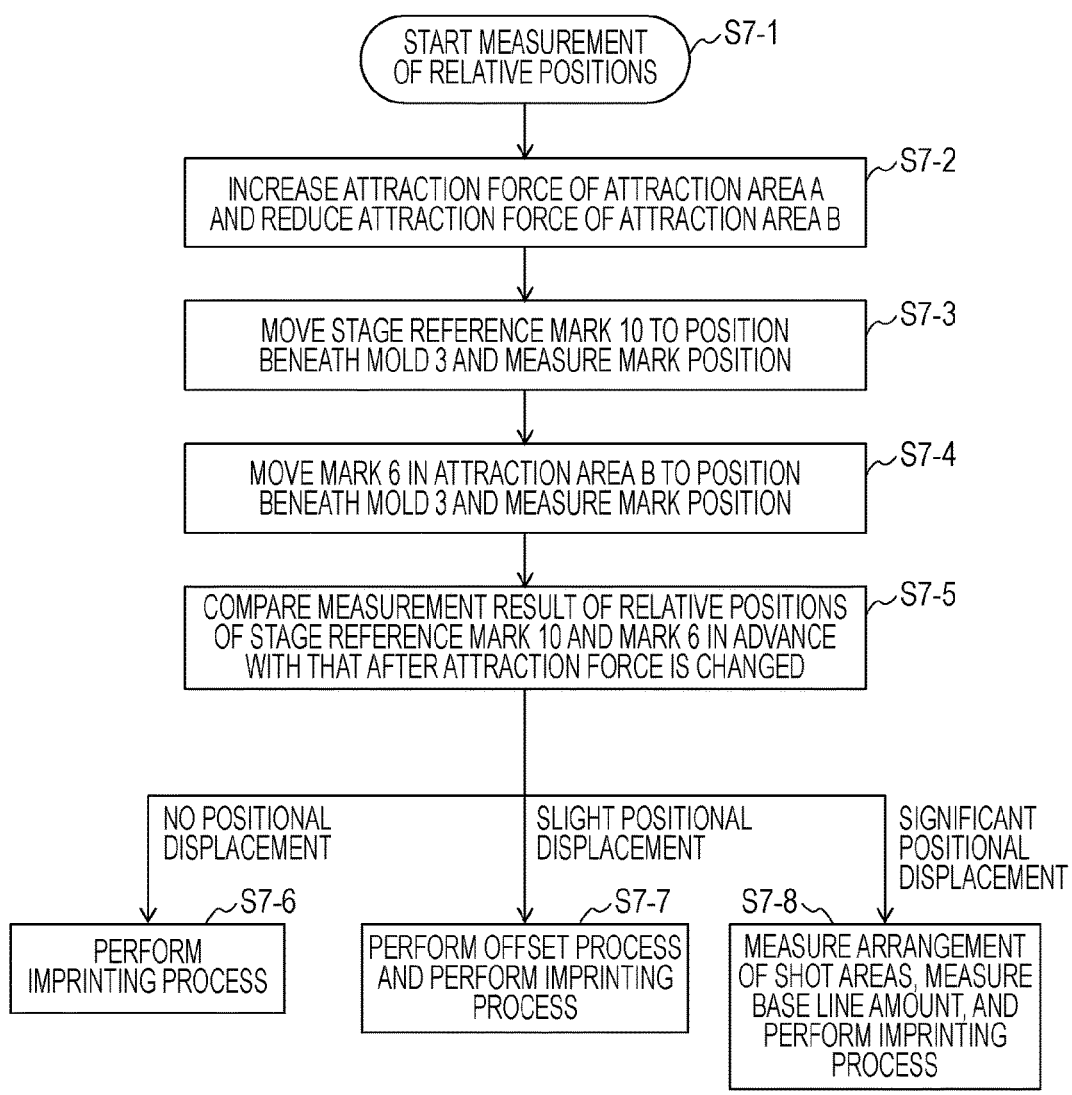
FIG. 7 illustrates the processing flow of measurement of a relative position according to a second exemplary embodiment.

Relative position measurement (step S40 of FIG. 3) according to a second exemplary embodiment is described next with reference to FIG. 7. FIG. 7 illustrates the processing flow of the relative position measurement performed in the imprinting method according to the second exemplary embodiment.

In the relative position measurement according to the first exemplary embodiment, the OAS 11 is used as the detecting unit. In contrast, in the relative position measurement according to the second exemplary embodiment, the detecting unit 7 mounted in the imprinting apparatus is used as the detecting unit, and measurement is performed. A scope that detects the mark on the substrate using light that has passed through the mold is used as the detecting unit 7.

Note that differences between the second exemplary embodiment and the first exemplary embodiment are described in detail. If description is not present, description given in the first exemplary embodiment can apply. According to the present exemplary embodiment, a pattern is formed in the shot areas of the substrate W corresponding to the attraction areas from the attraction area A to the attraction area B illustrated in FIG. 2.

If, after the pattern is formed in the shot area of the substrate W corresponding to the attraction area A, the magnitude of the attraction force of the attraction area A is changed (YES in step S39 of FIG. 3), the relative position measurement (step S40 of FIG. 3) starts (step S7-1).

In this example, the attraction force of the attraction area A is increased, and the attraction force of the attraction area B is reduced (step S7-2). For example, the magnitude of the attraction force of the attraction area A is set to "high", and the magnitude of the attraction force of the attraction area B is set to "medium".

According to the second exemplary embodiment, if the magnitude of the attraction force of the attraction area is changed, measurement is performed by detecting the mark using the detecting unit 7 to determine whether the relative positions of the substrate W and the substrate stage 8 has been changed. The mark 10 formed on the stage reference member 9 is moved to a position beneath the mold M, where the relative positions of the mark 5 formed on the mold M and the mark 10 are measured using the detecting unit 7 (step S7-3).

Subsequently, the substrate stage 8 is moved on the basis of the measurement value of the stage position measurement system 12 so that the mark 6 formed in the area of the substrate W corresponding to the attraction area B is located at a position beneath the mold M (the imprint position). At that time, the substrate stage 8 is moved on the basis of the result of measurement of the arrangement of the shot areas in step S32 of FIG. 3. After the substrate stage 8 moves, the mark 5 formed on the mold and the mark 6 formed on the substrate are detected by the detecting unit 7. Thus, the relative position of the mark 6 is measured (step S7-4). The detecting unit 7 may detect the alignment mark 14 instead of the mark 6.

The position of the mark 6 relative to the mark 10 can be obtained from the measurement results obtained in steps S7-3 and S7-4. By comparing the relative position of the mark 6 with the measurement result of the arrangement of the shot areas measured in advance in step S32 of FIG. 3, the position of the mark 6 relative to the substrate stage 8 (the amount of positional displacement) can be obtained (step S7-5).

If the positional displacement of the substrate W relative to the substrate stage 8 is present, the above-described relative positional relationship is possibly changed when the magnitude of the attraction force of the attraction area is changed. Accordingly, like the above-described first exemplary embodiment, the subsequent process is selected in accordance with the amount of positional displacement (steps S7-6 to S7-8). Steps S7-6 to S7-8 correspond to steps S6-6 to S6-8 of FIG. 6, respectively. The arrangement of the shot areas used in the imprinting process after the attraction force of the attraction area is changed in accordance with the amount of positional displacement can be obtained.

According to the second exemplary embodiment, the flow to determine the relative position between the mark 10 on the stage reference member 9 and the mark 6 on the substrate W is described. If the imprinting apparatus has stable accuracy of the base line amount and a stage position measuring system and, in addition, the substrate stage 8 has a sufficiently high positioning accuracy, the need for detection of the mark 10 using the detecting unit 7 in step S7-3 can be eliminated. When the attraction force of the attraction area is changed and if the position of the substrate W relative to the substrate stage 8 remains unchanged, the relative position between the mark 5 and the mark 6 detected by the detecting unit 7 should be the value obtained in advance (the value obtained in step S32 of FIG. 3) in step S7-4. Accordingly, the relative position between the mark 5 and the mark 6 obtained in step S7-4 can be used as the position of the substrate W relative to the substrate stage 8 (the amount of positional displacement) in step S7-5.

In this way, by using the detecting unit 7, the amount of relative positional displacement between the substrate W and the substrate stage 8 caused by changing the attraction force of the wafer chuck 2 for each of the attraction areas can be obtained. By selecting a suitable processing flow in accordance with the obtained amount of positional displacement and correcting the arrangement of the shot areas of the substrate, the imprinting process that reduces a decrease in the positioning accuracy can be performed.

Number of Detected Marks

In addition, in all of the above-described exemplary embodiments, after the magnitude of the attraction force of the attraction area is changed, the mark 6 formed in the shot area of the substrate W corresponding to the attraction area B is detected (steps S6-4 and S7-4). The number of the marks 6 detected by the OAS 11 or the detecting unit 7 may be one or greater. By detecting at least one marks, a shift component of the amount of positional displacement can be obtained. Furthermore, by detecting a plurality of the marks 6, a rotation component or a magnification component can be corrected in addition to the shift component. Still furthermore, the mark detected may be a mark formed in the shot area of the substrate W corresponding to the attraction area A or C in addition to the mark formed in the shot area corresponding to the attraction area B.

Device Manufacturing Method

The method for manufacturing a device (e.g., a semiconductor integrated circuit device or a liquid crystal display element) serving as a product includes a process for forming a pattern on a substrate (a wafer, a glass plate, or a film substrate) using the above-described imprinting apparatus. In addition, the method for manufacturing a device can include a process for etching the substrate having the pattern formed thereon. Note that if another product, such as a patterned media (a recording medium) or an optical element, is manufactured, the method for manufacturing a device can include another process for processing a substrate having a pattern formed thereon. The method for manufacturing a product according to the present exemplary embodiment is advantageous over an existing method in terms of at least one of the performance, quality, productivity, and manufacturing cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-152554 filed Jul. 23, 2013, which is hereby incorporated by reference herein in its entirety.

What is claimed is:

1. An imprinting method for forming a pattern of imprint material on a substrate supported by a substrate holding unit having at least a first attraction area and a second attraction area, attraction forces of the first attraction area and the second attraction area being changeable, the substrate having a plurality of shot areas, each having an alignment mark formed therein, the pattern being formed in each of the shot areas by using a mold, the method comprising:

reducing the attraction force of the first attraction area to less than the attraction force of the second attraction area when arrangement information regarding the shot areas are acquired and the pattern is sequentially formed in each of the shot areas using the arrangement information;

changing the attraction forces of the first attraction area and the second attraction area after forming the pattern in the shot area corresponding to the first attraction area;

detecting the alignment mark in the shot area corresponding to the second attraction area and obtaining position information regarding the shot area corresponding to the second attraction area;

measuring positional displacement of the shot area corresponding to the second attraction area in relation to the substrate holding unit by comparing the obtained position information with position information regarding the shot area corresponding to the second attraction area based on the arrangement information;

performing positioning of the substrate and the mold using the arrangement information if the measured positional displacement is less than or equal to a threshold value; and obtaining the arrangement information regarding the shot areas again and performing positioning of the substrate and the mold using the obtained arrangement information if the measured positional displacement is greater than the threshold value.

2. The imprinting method according to claim 1, wherein if the difference is less than or equal to the threshold value, positioning of the shot area is performed by adding the difference to the position information regarding the shot area based on the arrangement information as an offset.

3. The imprinting method according to claim 1, wherein when the arrangement information is obtained again, the alignment marks of at least two of the shot areas are detected, and wherein the arrangement information is obtained again on the basis of the detected alignment marks.

4. The imprinting method according to claim 1, wherein the changing the attraction forces is changing the attraction force of the second attraction area to less than the attraction force of the first attraction area.

5. An imprinting method for forming a pattern of an imprint material on a substrate supported by a substrate holding unit having at least a first attraction area and a second attraction area, attraction forces of the first attraction area and the second attraction area being changeable, the substrate having a plurality of shot areas, each having an alignment mark formed therein, the pattern being formed in each of the shot areas by using a mold, the method comprising:

when the pattern is sequentially formed in each of the shot areas after arrangement information regarding the shot areas are acquired, the substrate is moved based on the arrangement information to detect an alignment mark in each of the shot areas, and the position of each of the shot areas is acquired using a result of the detection, reducing the attraction force of the first attraction area to less than the attraction force of the second attraction area;

changing the attraction forces of the first attraction area and the second attraction area after forming the pattern in the shot area corresponding to the first attraction area;

detecting the alignment mark in the shot area corresponding to the second attraction area and obtaining position information regarding the shot area corresponding to the second attraction area;

measuring positional displacement of the shot area corresponding to the second attraction area in relation to the substrate holding unit by comparing the obtained position information with position information regarding the shot area corresponding to the second attraction area based on the arrangement information;

moving the substrate on the basis of the arrangement information to detect the alignment mark of the shot area and performing positioning of the substrate and the mold using the result of detection if the measured positional displacement is less than or equal to a threshold value; and obtaining the arrangement information regarding the shot areas again and moving the substrate on the basis of the obtained arrangement information to detect the alignment mark of the shot area and performing positioning of the substrate and the mold using the result of detection if the measured positional displacement is greater than the threshold value.

6. An imprinting apparatus for forming a pattern of an imprint material on a substrate by using a mold for each of a plurality of shot areas of the substrate, the apparatus comprising:

a detecting unit configured to detect an alignment mark formed in each of the shot areas;

a substrate holding unit configured to hold the substrate, the substrate holding unit having at least a first attraction area and a second attraction area, attraction forces of the first attraction area and the second attraction area being changeable;

a positioning unit configured to achieve relative positioning of the substrate and the mold; and a control unit configured to control operations of the detecting unit, the substrate holding unit, and the positioning unit, the control unit acquiring the arrangement information of the shot areas and sequentially forming the pattern in each of the shot areas using the arrangement information, wherein the control unit controls the substrate holding unit to reduce the attraction force of the first attraction area to less than the attraction force of the second attraction area, wherein after the pattern is formed in the shot area corresponding to the first attraction area, the control unit changes the attraction forces of the first attraction area and the second attraction area, wherein the control unit controls the detecting unit to detect the alignment mark in the shot area corresponding to the second attraction area, obtain position information regarding the shot area corresponding to the second attraction area, and measure positional displacement of the shot area corresponding to the second attraction area in relation to the substrate holding unit by comparing the obtained position information with position information regarding the shot area corresponding to the second attraction area based on the arrangement information, and wherein if the measured positional displacement is less than or equal to a threshold value, the control unit controls the positioning unit to achieve relative positioning of the substrate and the mold using the arrangement information, and if the measured positional displacement is greater than the threshold value, the control unit controls the positioning unit to obtain the arrangement information regarding the shot areas again and achieve relative positioning of the substrate and the mold using the obtained arrangement information.

7. The imprinting apparatus according to claim 6, wherein if the difference between the two position information is less than or equal to the threshold value, the control unit controls the positioning unit to achieve positioning of the shot area using a sum obtained by adding the difference to the position information regarding the shot area based on the arrangement information as an offset.

8. The imprinting apparatus according to claim 6, wherein when obtaining the arrangement information again, the control unit controls the detecting unit to detect the alignment marks of at least two of the shot areas and obtain the arrangement information again on the basis of the detected alignment marks.

9. The imprinting apparatus according to claim 6, wherein the control unit controls the substrate holding unit to reduce the attraction force of the second attraction area to less than the attraction force of the first attraction area.

10. A method for manufacturing a device for use in an imprinting apparatus, comprising:

forming a pattern in an imprint material provided on a substrate; and processing the substrate using the pattern formed in the imprint material, wherein the imprinting apparatus forms a pattern of an imprint material on the substrate by using a mold for each of a plurality of shot areas of the substrate, wherein the imprinting apparatus includes a detecting unit that detects an alignment mark formed in each of the shot areas, a substrate holding unit that has at least a first attraction area and a second attraction area to hold the substrate and that allows attraction forces of the first attraction area and the second attraction area to be changeable, a positioning unit configured to achieve relative positioning of the substrate and the mold, and a control unit that controls operations of the detecting unit, the substrate holding unit, and the positioning unit and that acquires arrangement information of the shot areas and sequentially forms the pattern in each of the shot areas using the arrangement information, wherein the control unit controls the substrate holding unit to reduce the attraction force of the first attraction area to less than the attraction force of the second attraction area, wherein after the pattern is formed in the shot area corresponding to the first attraction area, the control unit changes the attraction forces of the first attraction area and the second attraction area, wherein the control unit controls the detecting unit to detect the alignment mark in the shot area corresponding to the second attraction area, obtain position information regarding the shot area corresponding to the second attraction area, and measure positional displacement of the shot area corresponding to the second attraction area in relation to the substrate holding unit by comparing the obtained position information with position information regarding the shot area corresponding to the second attraction area based on the arrangement information, and wherein if the measured positional displacement is less than or equal to a threshold value, the control unit controls the positioning unit to achieve relative positioning of the substrate and the mold using the arrangement information, and if the measured positional displacement is greater than the threshold value, the control unit controls the positioning unit to obtain the arrangement information regarding the shot areas again and achieve relative positioning of the substrate and the mold using the obtained arrangement information.

* * * * *